United States Patent [19]
Eisenberg et al.

[11] Patent Number: 5,742,201
[45] Date of Patent: Apr. 21, 1998

[54] POLAR ENVELOPE CORRECTION MECHANISM FOR ENHANCING LINEARITY OF RF/MICROWAVE POWER AMPLIFIER

[75] Inventors: John A. Eisenberg, Los Altos; Brian L. Baskin, Cupertino; Charles Stuart Robertson, III, Sunnyvale; Dieter Werner Statezni, Palo Alto; Lance Todd Mucenieks, Boulder Creek; David Lee Brubaker, Los Altos, all of Calif.

[73] Assignee: Spectrian, Sunnyvale, Calif.

[21] Appl. No.: 594,089

[22] Filed: Jan. 30, 1996

[51] Int. Cl.6 .................................................. H03F 1/32
[52] U.S. Cl. ............................. 330/2; 330/136; 330/149
[58] Field of Search .............................. 330/2, 136, 145, 330/149, 284; 333/139

[56] References Cited

U.S. PATENT DOCUMENTS

| | | | |
|---|---|---|---|
| 3,886,470 | 5/1975 | O'Neil et al. | 330/149 |
| 4,389,618 | 6/1983 | Bauman | 330/149 |
| 4,524,336 | 6/1985 | Franke | 332/144 |
| 4,560,945 | 12/1985 | Olver | 330/149 |
| 4,580,105 | 4/1986 | Myer | 330/149 |
| 4,879,519 | 11/1989 | Myer | 330/52 |
| 4,885,551 | 12/1989 | Myer | 330/52 |
| 4,987,378 | 1/1991 | Eggleston et al. | 330/149 |
| 5,015,965 | 5/1991 | Katz et al. | 330/149 |
| 5,051,704 | 9/1991 | Chapman et al. | 330/52 |
| 5,065,110 | 11/1991 | Ludvik et al. | 330/149 |
| 5,077,532 | 12/1991 | Obermann et al. | 330/151 |
| 5,101,172 | 3/1992 | Ikeda et al. | 330/136 |
| 5,117,197 | 5/1992 | Hsu et al. | 330/149 |
| 5,119,399 | 6/1992 | Santos et al. | 332/103 X |
| 5,126,687 | 6/1992 | Onoda et al. | 330/149 |
| 5,148,117 | 9/1992 | Talwar | 330/151 |
| 5,155,448 | 10/1992 | Powell | 330/149 |
| 5,157,345 | 10/1992 | Kenington et al. | 330/249 |
| 5,157,346 | 10/1992 | Powell et al. | 330/151 |
| 5,166,634 | 11/1992 | Narahashi et al. | 330/151 |
| 5,304,945 | 4/1994 | Myer | 330/148 |
| 5,307,022 | 4/1994 | Tattersall, Jr. et al. | 330/52 |
| 5,323,119 | 6/1994 | Powell et al. | 330/151 |
| 5,334,946 | 8/1994 | Kenington et al. | 330/144 |
| 5,365,190 | 11/1994 | Yu et al. | 330/149 |
| 5,508,657 | 4/1996 | Behan | 330/149 X |

FOREIGN PATENT DOCUMENTS

| | | | |
|---|---|---|---|
| 113603 | 7/1982 | Japan | 330/149 |
| 78902 | 4/1987 | Japan | 330/149 |
| 56008 | 3/1988 | Japan | 330/149 |
| 2 254 505 | 7/1992 | United Kingdom . | |

OTHER PUBLICATIONS

"Adaptation Behavior of a Feedforward Amplifier Linearizer" by James K. Cavers; IEEE Transactions on Vehicular Technology, vol. 44, No. 1, Feb., 1995, pp. 33–40.

"A High Efficiency 835 MHz Linear Power Amplifier for Digital Cellular Telephony" by M.J. Koch and R.E. Fisher, AT&T Bell Laboratories, Whippany, New Jersey 07981, IEEE 1989, pp. 17–18.

(List continued on next page.)

*Primary Examiner*—James B. Mullins
*Attorney, Agent, or Firm*—Charles E. Wands

[57] ABSTRACT

Linearity of an RF/microwave power amplifier is enhanced by an amplitude and phase distortion correction mechanism based upon signal envelope feedback, that operates directly on the RF signal passing through the power amplifier. A phase-amplitude controller responds to changes in gain and phase through the RF/microwave power amplifier signal path caused by changes in RF input power, DC power supply voltages, time, temperature and other variables, and controls the operation of a gain and phase adjustment circuit, so as to maintain constant gain and transmission phase through the RF/microwave power amplifier.

12 Claims, 8 Drawing Sheets

OTHER PUBLICATIONS

"Comparison of linear Single–Sideband Transmitters with Envelope Elimination and Restoration Single–Sideband Transmitters", by Leonard R. Kahn from Proceedings of the IRE, Dec. 1956, pp. 1706–1712.

"Single–Sideband Transmission by Envelope Elimination and Restoration" by Leonard R. Kahn from Proceedings of the IRE, Jul. 1992, pp. 803–806.

"Linear Amplification Technique for Digital Mobile Communications" by Yoshinori Nagata, NEC Corporation, 1989 IEEE, pp. 159–164.

"An Adaptive Predistorter for a Power Amplifier Based on Adjacent Channel Emissions" by Shawn P. Stapleton and Falviu C. Costescu, IEEE Transactions on Vehicular Technology, vol. 41, No. 1, Feb., 1992, pp. 49–56.

"A Linearizing Predistorter with Fast Adaptation" by James K. Cavers, 1990 IEEE, pp. 41–47.

"Experimental Performance of an Adaptive Digital Linearized Power Amplifier", by Andrew S. Wright and Willem G. Durtler, IEEE Transactions on Vehicular Technology, vol. 41, No. 4, Nov. 1992, pp. 395–400.

"Linear Amplification with Nonlinear Components" by D.C. Cox, IEEE Transactions on Communications, Dec., 1974, pp. 1942–1945.

"The Combined Analogue Locked Loop Universal Modulator" (CALLUM) by A. Bateman, Centre for communications Research, University of Bristol, 1992 IEEE, pp. 759–763 No Month.

"Broadband Linear Amplifier Design for a PCN Base–Station", by P.B. Kenington et al, University of Bristol, Centre for Communications Research, 1991 IEEE, pp. 155–160 no month.

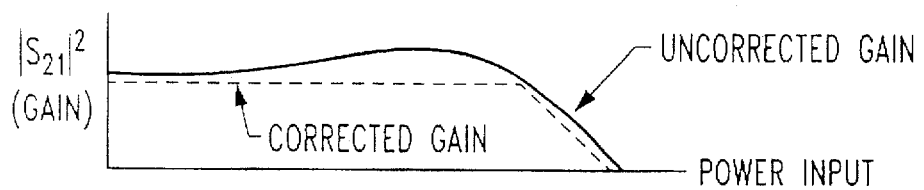
FIG. 5
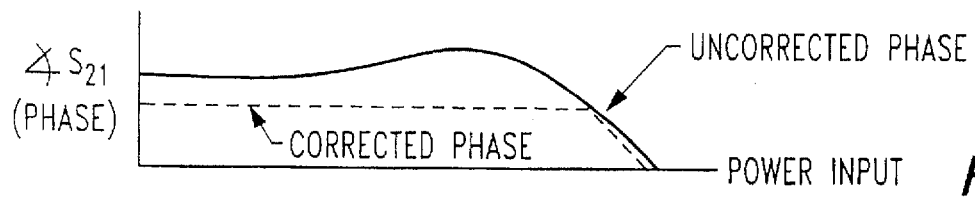
FIG. 6
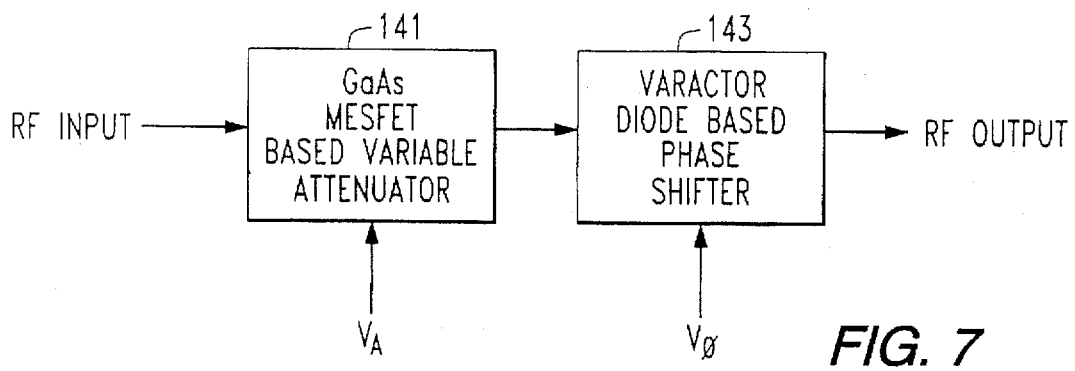
FIG. 7
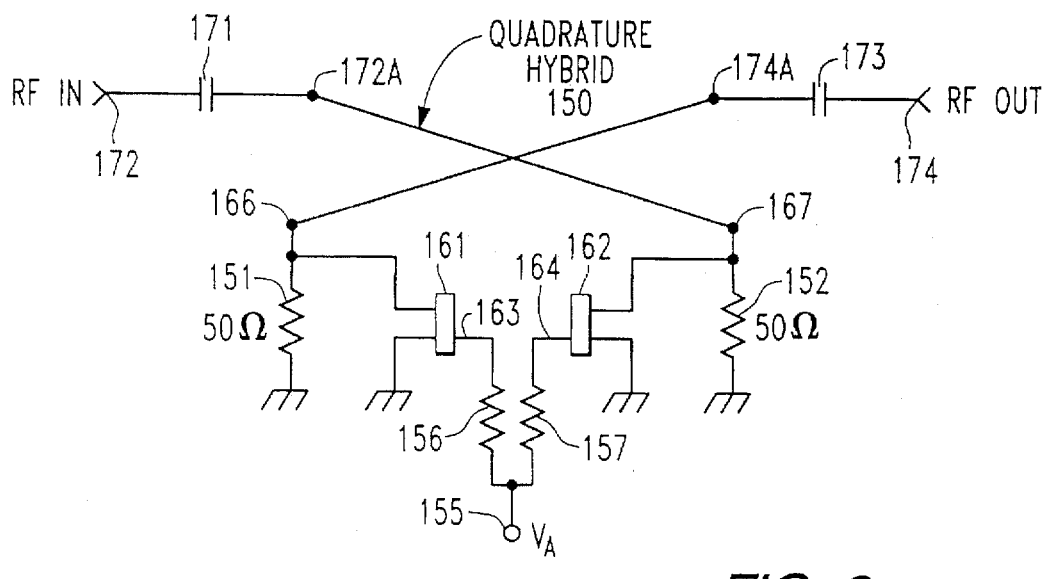
CONTROL VOLTAGE    FIG. 8

POLAR ENVELOPE CORRECTION MECHANISM FOR ENHANCING LINEARITY OF RF/MICROWAVE POWER AMPLIFIER

FIELD OF THE INVENTION

The present invention relates in general to communication systems, and is particularly directed to a polar envelope responsive correction mechanism for reducing amplitude and phase distortion in a microwave and RF power amplifier that is designed to amplify signals whose bandwidth is in the KHz to low MHz spectral range.

BACKGROUND OF THE INVENTION

As the wireless communications market continues to expand, the accompanying need for increased capacity is forcing a move from analog modulation techniques, such as frequency modulation (FM), to digital modulation formats, such as time division multiple access (TDMA) and code division multiple access (CDMA), which have bandwidths listed in Table 1.

TABLE 1

| US DAMPs (TDMA) | 30 kHz |
| GSM | 277 kHz |
| CDMA | 1.23 MHz |

Both TDMA and CDMA modulation require somewhat greater linearity than can be routinely obtained in an uncorrected, high efficiency class AB power amplifier. Unfortunately, conventional correction mechanisms, such as feed forward or predistortion schemes, are complex, inefficient, and prohibitively expensive to be practical solutions for correcting distortion in the majority of single carrier linear power amplifiers. Since baseband I and Q data is usually not available at the power amplifier, baseband correction techniques which make use of baseband signals, such as baseband cartesian feedback, are also not applicable.

SUMMARY OF THE INVENTION

The present invention takes advantage of the relatively modest bandwidth of digital modulation formats such as those shown in Table 1, by providing an amplitude and phase distortion correction strategy that is based upon signal envelope feedback. In particular, the present invention provides a simple, yet efficient and effective way of improving the linearity of a non-linear microwave/RF power amplifier employed for digital modulation formats having signal bandwidths in the KHz to low MHz range, through the use of a polar envelope-responsive correction (PEC) mechanism, which operates directly on the RF signal passing through the power amplifier, requires no baseband information, and reduces the AM-to-PM and AM-to-AM distortion which causes spectral regrowth of digital modulation formats such as TDMA, CDMA and GSM. The correction mechanism of the invention enables the power amplifier to comply with linearity and spectral regrowth requirements imposed by both government regulatory agencies (such as the Federal Communications Commission (FCC)) and industry standards.

In accordance with a first embodiment of the polar envelope-responsive correction scheme of the present invention, an RF/microwave input signal to be amplified by the power amplifier of interest is initially subdivided or split into two signal components, a first of which is conveyed through a main (M) signal path through the amplifier, and a second of which is conveyed through a reference (R) signal path separate from the main path through the amplifier. Before passing through the RF amplifier of interest, the main path signal is processed by an amplitude and phase adjustment circuit. A portion of the RF power amplifier output is fed back through a directional coupler and fixed gainset attenuator to be compared with the signal on the reference path. The comparison is made by the fast phase amplitude controller (PAC).

A delay line is usually installed in the reference path to reduce phase differences between the main and reference paths which arise from the larger delay of the main path. This ensures that the main and reference path signals arrive at the phase amplitude controller at the same time.

The phase-amplitude controller compares the composite amplitude and phase of the delayed input signal spectrum delivered via the reference path to its R input with the corresponding amplitude and phase components of the output signal spectrum of amplifier delivered to its M input, and generates respective amplitude and phase adjustment control voltages $V_A$ and $V_\Phi$. These amplitude and phase adjustment control voltages, which are coupled through respective loop filters to control the amplitude and phase adjustment circuits in such a manner as to maintain constant gain and phase through the main signal path between the RF input at the input signal splitter to the directional coupler output port. The amplitude adjustment control voltage $V_A$ is proportional to the difference between the amplitudes of the envelopes of the signals, and the phase control signal $V_\Phi$ is proportional to the phase difference between the envelopes of the signals applied to the M and R input ports of the fast phase-amplitude controller.

The PAC responds to changes in main path gain and phase caused by changes in RF input power, DC power supply voltages, time, temperature and other variables. The feedback signal from the directional coupler controls the amplitude/gain and phase adjustment circuit, so that constant gain and transmission phase through the RF amplifier are maintained. The control system bandwidth is normally set several times above the highest frequency component contained in the envelope of the RF signal passing through the amplifier.

In order to maintain stability, the inverse of the time delay $(1/t)$ through the feedback path is greater than the bandwidth occupied by the envelope of the signal being processed. The amplitude control loop and the phase control loop interact minimally with one another and have adequate bandwidth to process all of the frequency components contained in the spectrum of the input signal envelope. The response of both of the gain and phase control loops is such that each loop has adequate gain and phase margin to prevent instability and unacceptable transient behavior.

The amplitude/gain and phase adjustment circuit has a phase range greater than the maximum phase change through the main signal path under all conditions of RF input power, temperature, supply voltage, signal frequency or other environmental variables impacting the transmission phase of the main signal path. Also, its amplitude range is greater than the maximum gain change through the main signal path under any combination of such conditions. Moreover, the high frequency response of the feedback loops are controlled to ensure that envelope frequency components beyond the loop bandwidth do not significantly degrade the raw performance of the power amplifier.

To avoid control loop stability problems, the amplitude and phase transfer functions of the amplitude/gain and phase adjustment circuit are smooth, monotonic functions of the control voltages $V_A$ and $V_\phi$ generated by the fast phase-amplitude controller. The bandwidth of the PAC and amplitude and phase control elements are significantly greater than the overall loop bandwidth, so that the loop bandwidth is set by the responses of the loop filters.

Pursuant to a first embodiment, the amplitude/gain and phase adjustment circuit comprises a fast variable attenuator and a fast phase shifter coupled in cascade. The variable attenuator is phase-linear and has an extremely fast, flat and low insertion loss, with a dynamic range of more that 12 dB and a control bandwidth greater than 20 MHz. Such an attenuator is preferably implemented as a MESFET-based attenuator circuit, having a quadrature hybrid circuit that is terminated in identical variable resistors coupled in parallel with respective (GaAs) MESFETs. The MESFETs are operated as variable resistors, having their gate electrodes coupled to receive the above-referenced control voltage $V_A$ generated by the phase-amplitude controller.

When the control input voltage $V_A$ to each MESFET is biased at a first DC voltage value (e.g. −5V), current flow through the MESFETs' source-drain paths is cut off, so that the MESFETs are rendered non-conductive or placed in the high impedance state. As a result, all of the RF energy delivered to the input of the fast variable attenuator and the quadrature hybrid attenuator will be absorbed by the MESFET's parallel 50 ohm resistors, thereby providing maximum attenuation. As the control voltage $V_A$ applied to the MESFET gate terminals is increased (e.g., from −5V toward zero volts), the effective resistance of the MESFETs and their parallel resistors decreases, since the parallel resistors become shunted by the monotonically decreasing resistance of the MESFETs, whereby more and more RF energy is reflected to the fast variable attenuator's RF output port.

The phase shifter is configured in a manner similar to the attenuator with a pair of back-to-back matched varactor diodes, biased through a pair of inductors and dc isolated by a pair of capacitors. The back to back varactors replace the parallel resistors and the MESFETs of the variable attenuator circuit, described above. Commonly connected cathodes of the respective pairs of varactor diodes are coupled to receive the control voltage $V_f$ generated by the phase-amplitude controller. In operation, as $V_\phi$ is varied (e.g., from +1V to +10V), the capacitive susceptance presented by the diodes to the quadrature hybrid circuit changes sufficiently to yield a change in phase (e.g., on the order of 120 degrees). For linear capacitance vs. voltage characteristics, the back-to-back varactor diode configuration results in no net capacitance change with RF drive, greatly reducing the level of odd order intermodulation products ($m f_1 - n f_2$ where $m \leq 1$, and m+n is odd). The result is a flat, phase linear, high intercept point phase shifter with low insertion loss and an extremely fast response. Both the MESFET variable attenuator and the varactor diode phase shifter have intercept points greater than +41 dBm, so that the overall gain phase adjuster intercept point is over +38 dBm. The control bandwidth of both the variable attenuator and phase shifter is in excess of 20 MHz.

In accordance with a second embodiment, the amplitude/gain and phase adjustment circuit may be implemented as a vector modulator comprising quadrature hybrid connected to two of the variable attenuators of the first embodiment, whose outputs are combined in an in-phase power combiner. The quadrature hybrid splits an incoming signal into two equal amplitude signals, which are 90° out of phase (phase quadrature). The two quadrature signals are attenuated by respective in-phase (I) and quadrature (Q) fast variable attenuators in accordance with separate control signals. What results are two phase quadrature vectors, each of which may have any desired amplitude from zero to one-half that of the RF input power level. Summing these two vector signals in the in-phase power combiner yields a resultant signal vector having a phase control range of nearly 90° and an amplitude control range of greater than 15 dB.

According to a third embodiment of the amplitude/gain and phase adjustment circuit, the variable attenuators of the vector modulator of the second embodiment are replaced by the phase shifter of the first embodiment. A quadrature hybrid is coupled to the two phase shifters, outputs of which are coupled to a downstream in-phase power combiner. To provide phase shifting, the same step in control voltage is applied to each of the phase shifters, so that they produce identical phase shifts. As a result, each quadrature signal derived by the quadrature hybrid is subjected to the same amount of phase shift. If opposite steps in control voltage are applied to each of the linear phase shifters, the amplitude of the resultant signal vector R may be controlled. Thus, differential changes between the two control voltages produce amplitude modulation and common changes between the two control voltages provide phase shift.

A first embodiment of the high speed phase/amplitude controller includes a differential peak detector circuit used for envelope amplitude comparison and a phase bridge which operates as a phase detector. In the differential peak detector, the main and reference path signals are coupled to peak detector diode circuits and to (+) and (−) input ports of a first differential amplifier. The first differential amplifier takes the difference between the voltages applied to the peak detector circuits and provides a difference control signal $V_A$ that is proportional to the difference of the amplitude of the envelopes of the signals incident on the R and M ports. The phase detector bridge circuit is coupled to respective transmission line sections by means of resistor divider networks. Biased diode peak detectors connect center nodes of the resistive divider networks to (−) and (+) inputs of a second differential amplifier, and provide samples of the envelope of the signals derived from nodes along the matched, terminated transmission lines carrying the R and M signals. The difference between the outputs of these peak detectors is derived as the control voltage $V_\phi$. The phase detector's differential amplifier output voltage $V_\phi$ passes through zero, when the R and M input voltages are exactly 180° out of phase, which is the response required for proper operation. The phase detector has a practical range of greater than ±60° about the 180° null in output. Range can be traded for sensitivity by altering the spacing between the resistor divider nodes along the main path transmission line.

A second embodiment the high speed phase/amplitude controller comprises peak detectors and a Gilbert multiplier. In this embodiment, the R and M inputs, offset from each other by 90° are split into two paths by power dividers. One of the R paths and one of the M paths is each peak detected by means of a pair of matched biased diode detectors and coupled to (+) and (−) inputs of a differential amplifier. The output of this differential amplifier is the control voltage $V_A$. $V_\phi$ is obtained by multiplying the remaining R and M signals limited by phase-matched limiters in a wideband Gilbert cell multiplier, and low pass filtering the result by means of a low pass filter or integrator. The phase matched limiters remove amplitude information and make the control voltage $V_\phi$ nearly independent of amplitude. The output of the low pass filter is coupled to the (+) input of a differential amplifier, while an adjustable DC offset voltage derived from a variable voltage reference is supplied to its (−) input of the differential amplifier.

The Gilbert cell multiplier functions as a multiplier over at least 40 dB of dynamic range to either of its inputs as opposed to a diode mixer, which is less than 10 dB of dynamic range on its local oscillator port. The low pass filter removes products at twice the RF frequency but does not impact loop bandwidth. The combination of the limiters, Gilbert cell multiplier, low pass filter, voltage offset and scaling amplifier operate as a phase detector over nearly 180° of phase difference.

A third embodiment of the phase/amplitude controller employs passive ±45° phase shift networks. Signals incident at the R and M ports of the phase/amplitude controller are divided by a first in-phase, three-way power divider into three in-phase paths, and a second in-phase, three-way power divider into three in-phase paths. Each of the R signal path and the M signal path is coupled to respective peak detectors, which are coupled to respective (+) and (−) inputs of a differential amplifier. The output of this differential amplifier provides amplitude control voltage $V_A$ previous previous embodiments. The remaining two R paths are phase shifted by plus and minus 45° phase shifters, to yield a broadband +90° differential phase between the two R signals. Similarly, the M paths are phase shifted by plus and minus 45° phase shifters, to yield a broadband −90° differential phase between the two M signals.

The +45° shifted R signal at the output of +45° phase shifter is summed with the −45° shifted M signal at the output of the −45° phase shifter. The resulting sum is peak detected by a peak detector circuit and applied to a first (+) input of a high speed differential amplifier. Similarly, the −45° shifted R signal at the output of −45° phase shifter is summed with the +45° shifted M signal at the output of +45° phase shifter. The resulting sum is peak detected by a peak detector circuit and applied to a second (−) input of the differential amplifier. The differential amplifier derives the output voltage $V_\Phi$ as the difference between the outputs of the two peak detectors, thereby providing a high speed phase detector with a ±90° range.

A fourth embodiment of the phase/amplitude controller is configured as an I,Q demodulator, using Gilbert multipliers in place of conventional diode based mixers. In this embodiment, the R input is divided by a quadrature hybrid into quadrature signals that are coupled to first inputs of respective Gilbert multipliers. Second, in-phase inputs of the Gilbert multipliers are derived from the outputs of an in-phase power divider to which the M signal is applied. The outputs of the Gilbert multipliers are coupled through respective low pass filters to wideband amplifiers, from which the control voltages $V_I$ and $V_Q$ are derived. These voltages are suitable for driving a rectangular representation of the amplitude A and phase ($_\Phi$) differences between the signals applied to the R and M ports of this phase amplitude controller. Thus $V_I$ is proportional to $A_{COS\Phi}$ and $V_Q$ is proportional to $A_{SIN\Phi}$.

Unlike the previous embodiments of the phase/amplitude controller, which are polar output devices, and therefore require a translation network that approximates a polar-to-rectangular conversion operation in order to drive I and Q control inputs of a vector modulator (the amplitude/gain and phase adjustment circuit), the fourth embodiment of the phase/amplitude controller provides rectangular coordinate control voltages that are capable of directly driving the vector modulator.

The bandwidth of the control loops that is required to reduce amplifier distortion increases as the occupied bandwidth of the modulated signal incident on the amplifier increases. Increasing the control loop bandwidth requires that both the operational amplifier and the amplitude and phase modulators slew at extremely fast rates. However, a portion of the error being corrected by the loop is caused by other parameters, such as temperature, component aging and the like, and is relatively slow.

In accordance with a further embodiment of the polar envelope correction mechanism of the present invention, each control loop (amplitude and phase) is subdivided into a relatively fast loop portion, which is capable of correcting the amplifier's distortion in real time, at rates imposed by the modulation on the RF signal, and a relatively slow loop that responds to slow changes in amplitude and phase induced by changes in the environment. The relatively slow loop responds down to DC and the fast loop is AC coupled.

For this purpose, the gain/phase adjuster in the main signal path is implemented as a slow gain/phase adjuster, connected in cascade with a fast gain/phase adjuster. The control voltages $V_A$ and $V_\Phi$ generated by the phase/amplitude controller for the two gain/phase adjusters are coupled through respective slow and fast pair of loop filters. Such separate loops not only reduce the slew rate requirements imposed on loop components but also reduce the amount of the range of the amplitude and phase adjuster that must be traversed at fast rates. As a result, the relatively slow and fast loops can be centered in an optimal portion of the control component's (variable attenuator, phase shifter, vector modulator) operating curve. This greatly eases the task of obtaining stable, wide bandwidth control loops. Namely, dividing each loop into a relatively fast loop that tracks the modulation envelope of the signal incident on the RF amplifier, and a relatively slow loop that tracks only environmentally induced changes facilitates the design of stable wideband polar envelope correction loops.

In order to determine whether the correction circuitry is functioning properly, the polar envelope correction mechanism of the present invention incorporates an alarm circuit, which employ window comparator circuits that monitor the vector modulator inputs signals. Any excursions beyond the normal voltage levels indicate a failure of the vector modulator to correct the error signals. Overall correction is determined by the average, not instantaneous, response of the vector modulator, so that the outputs of the window comparators must be integrated. If the integrated outputs fall below reference amplitude and phase voltages, respective threshold detectors provide alarm signals indicating that the correction is not valid. Failure of the correction circuitry is determined when the output signal at output terminal fails to track the input signal, whether it results from failure, environmental or input over drive conditions. This approach determines failure and does not require monitoring all the various electronic circuits in a given system including power amplifier, RF gain stages, detection circuitry and any video circuits.

BRIEF DESCRIPTION OF THE DRAWINGS

FIGS. 5 and 6 respectively illustrate variations in amplitude and phase distortion as a function of RF power input for a typical RF power amplifier with and without the polar envelope control mechanism of the present invention;

FIG. 7 diagrammatically illustrates the configuration of the gain/phase adjuster of the amplifier of FIG. 4;

FIG. 8 schematically illustrates a MESFET-based variable attenuator circuit;

DETAILED DESCRIPTION

Figure 1:
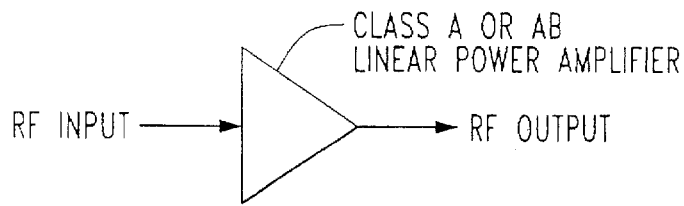
FIG. 1 diagrammatically illustrates a typical class A or class AB power amplifier.

Before describing in detail the new and improved polar envelope correction mechanism for improving RF amplifier linearity in accordance with the present invention, it should be observed that the invention resides primarily in what is effectively a prescribed arrangement of conventional communication circuits and components. Consequently, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to show the major components of the system in a convenient functional grouping, whereby the present invention may be more readily understood.

As described briefly above, the polar envelope correction mechanism of the present invention is used to reduce both amplitude distortion and phase distortion of a microwave and RF power amplifier that amplifies signals having a signal bandwidth in the KHz to low MHz range, and is capable of substantially reducing spectral regrowth of digital modulation formats such as TDMA, CDMA and GSM in power amplifiers.

Figure 2:
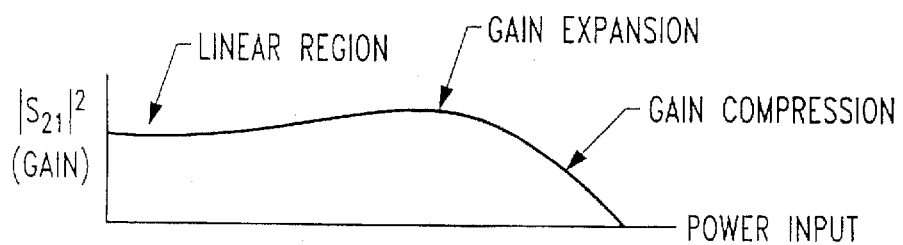
FIGS. 2 and 3 respectively illustrate the AM—AM distortion and AM-PM distortion of the amplifier of FIG. 1.
Figure 3:
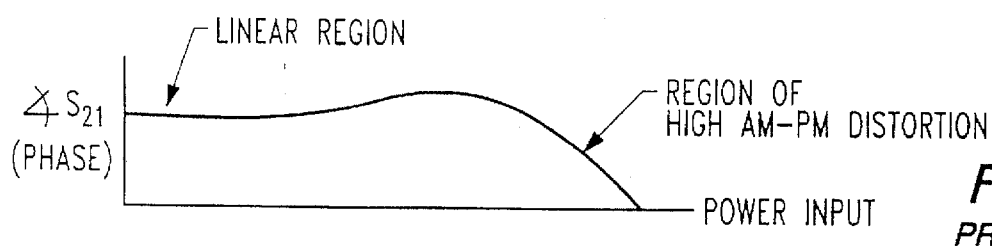

FIG. 1 diagrammatically illustrates a typical class A or class AB power amplifier, while FIGS. 2 and 3 respectively illustrate the AM—AM distortion and AM-PM distortion of such an amplifier as a function of RF power input. The amplifier's AM—AM and AM-PM distortion are the cause of spectral regrowth and intermodulation distortion. As will be described, the polar envelope correction mechanism of the present invention is operative to reduce AM—AM and AM-PM distortion of such a power amplifier over as large an input dynamic range as possible, and achieves sufficient linearity to meet government and industry standard requirements for the modulation format in use.

Figure 4:
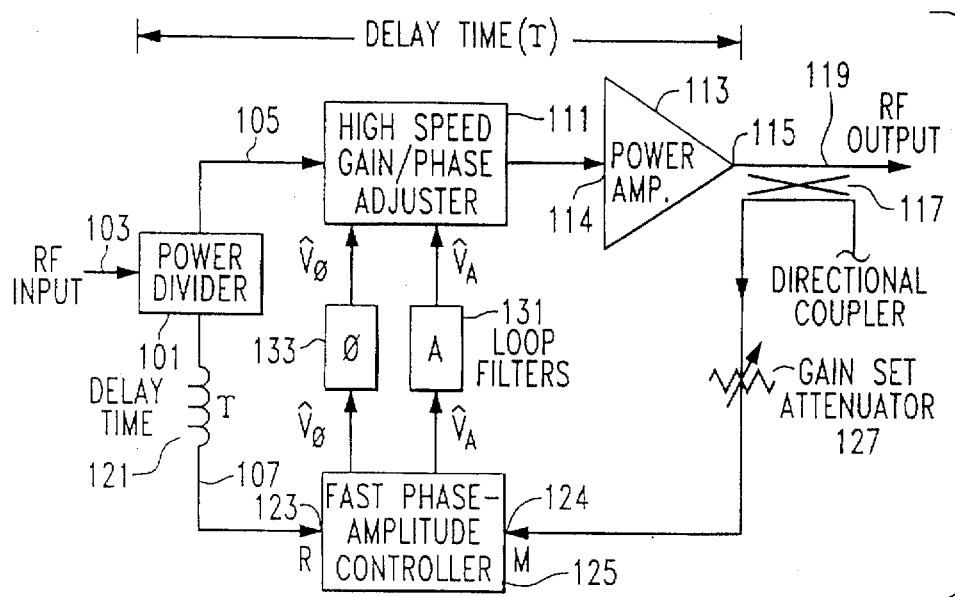
FIG. 4 diagrammatically illustrates a linear power amplifier which incorporates the polar envelope correction mechanism of the present invention.

Referring now to FIG. 4, a non-limiting example of a linear power amplifier, which incorporates the polar envelope correction mechanism of the present invention is presented diagrammatically as comprising an input power divider 101, which splits or divides an input signal that is applied to an input terminal 103 into two signal paths 105 and 107. The first or main signal path 105, imparts a delay of t seconds and conveys the input signal to a high speed gain/phase adjuster 111 (shown in detail in FIG. 7, to be described), the output of which is coupled to the input 114 of an RF power amplifier 113. The output 115 of RF power amplifier 113 is coupled through a directional coupler 117 to an RF output terminal 119.

The second or reference input signal path 107 conveys the input signal through a delay line 121, which causes the split input signal on path 107 to arrive at a first, R input 123 of a fast phase-amplitude controller (PAC) 125 (to be described in detail below with reference to FIG. 17) at the same time as the corresponding signal at the output of the power amplifier 113, which is extracted by the directional coupler 117 and fed back through a gain set attenuator 127 to a second, M input 124 of PAC 125. PAC 125 compares the composite amplitude and phase of the delayed input signal spectrum (reference) delivered over path 107 to its R input with the corresponding amplitude and phase components of the output signal spectrum of amplifier 113 delivered to the M input of PAC 125.

PAC 125 generates control voltages $V_A$ and $V_\Phi$, at the outputs of their respective loop filters 131 and 133, which are used to control gain/phase adjuster 111 in such a manner as to maintain constant gain and phase from the overall system's RF input to its output 119. PAC 125 responds to changes in main path gain and phase caused by changes in RF input power, DC power supply voltages, time, temperature and other variables. The feedback controls the gain/phase adjuster 111 in the main signal path 105, so that constant gain and transmission phase are maintained. The control system bandwidth is several times the highest frequency component contained in the envelope of the RF signal passing through the amplifier. The manner in which this process affects the AM—AM and AM-PM distortion of the RF power amplifier is diagrammatically illustrated in FIGS. 5 and 6, which respective illustrate variations in amplitude and phase distortion as a function of RF power input for a typical RF power amplifier with and without the polar envelope control mechanism of the present invention.

Like any other control loop, the amplitude control loop and the phase control loop, which are largely independent of each other, must have adequate bandwidth to process all of the frequency components contained in the spectrum of the signal envelope. The response of both loops must be such that each loop has adequate gain and phase margin to prevent instability and unacceptable transient behavior. In order to maintain stability, the inverse of the time delay (T) through the feedback path must be much greater than the bandwidth ($BW_{ENV}$) occupied by the envelope of the signal being processed. Namely, $1/>>BW_{ENV}$.

The high speed gain/phase adjuster 111 must satisfy the following performance requirements. First, its phase range must be greater than the maximum phase change measured in the main path under any condition of RF input power, temperature, supply voltage, signal frequency or other environmental variables impacting the transmission phase of the main signal path 105. Also, its amplitude range must be greater than the maximum gain change measured in the main signal path 105 under any combination of the above described conditions. (Phase linearity and amplitude flatness are not typically an issue over the modest envelope bandwidths involved). The loop frequency response must be designed so as not to further degrade the amplifier's distortion beyond the loop bandwidth.

In addition, the amplitude and phase transfer functions must be smooth, monotonic functions of control voltages to avoid control loop stability issues. Finally, the amplitude and phase detection and control components bandwidth must be significantly greater than the overall loop bandwidth, so that the loop bandwidth is set by the response of the loop filters. The response of both the amplitude and phase control loop components and the delay time imparted by main path 105 should be designed so that these parameters are not significant factors in determining the control loop response.

FIG. 7 diagrammatically illustrates the configuration of the gain/phase adjuster 111 of FIG. 4, as comprising a fast variable attenuator 141 and a fast phase shifter 143 connected in cascade. Variable attenuator 141 may be implemented as a MESFET-based attenuator circuit, schematically illustrated in FIG. 8 as comprising a quadrature hybrid circuit 150 that is terminated in identical variable resistors each composed of a 50W resistor 151 and 152 are connected in parallel with respective GaAs MESFETs 161 and 162. MESFETs 161 and 162 are operated as variable resistors, having their source-drain paths connected between respective nodes 166 and 167 and ground, and their gate electrodes 163, 164 coupled to receive a control voltage $V_A$ applied to a control terminal 155. The control voltage $V_A$ is coupled to the gates 163 and 164 of MESFETs 161 and 162 through respective isolation resistors 156 and 157. Node 172A is coupled through coupling capacitor 171 to main path RF input terminal 172. Node 174A is coupled through coupling capacitor 173 to main path output terminal 174. These capacitors function as dc blocking capacitors in the RF signal path.

In operation, when variable resistor MESFETs 161 and 162 are biased ($V_A$=−5V), current flow through their source-drain paths is cut off, so that MESFETs 161 and 162 are non-conductive or in the off state. As a result, all of the RF energy delivered to the input terminal 172 of the quadrature hybrid attenuator 150 will be absorbed by the 50W resistors 151 and 152, whereby the attenuation is maximum. From this off condition, as the control voltage $V_A$ applied to control terminal 155 is increased (from −5V toward zero volts), the effective resistance between nodes 166, 167 and ground decreases as 50W resistors 151 and 152 become shunted by a monotonically decreasing resistance of MESFETs 151 and 152, so that more and more RF energy is reflected to the RF output port 174. The result is an extremely fast, flat, low insertion loss, phase linear variable attenuator, with a dynamic range of more that 12 dB and a control bandwidth greater than 20 MHz.

Figure 9:
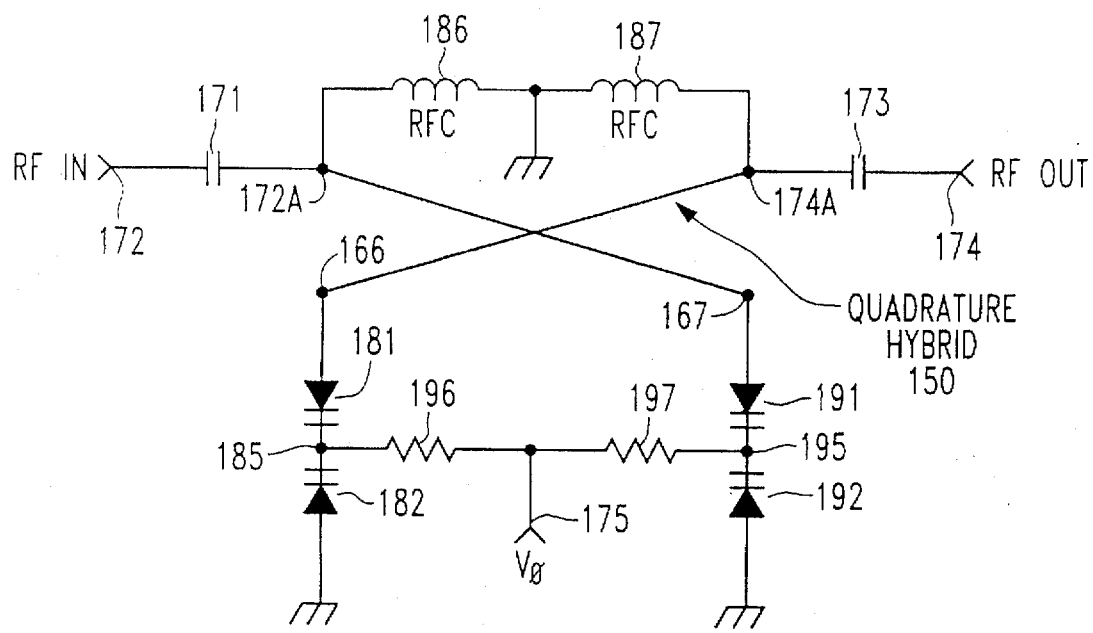
FIG. 9 diagrammatically illustrates the configuration of a varactor based phase shifter.

FIG. 9 diagrammatically illustrates the configuration of the varactor based phase shifter 143 of FIG. 7, consisting of two pairs of back-to-back matched varactor diodes, shown at 181, 182 and 191, 192, replacing resistors 151, 152 and MESFETs 161, 162 of the variable attenuator circuit of FIG. 8. Inductors 186 and 187 are high impedance at the RF frequency and function as a ground return for the upper varactors 181 and 191. Namely, In the circuit of FIG. 9, the quadrature hybrid circuit 150 is terminated in respective pairs of back-to-back matched varactor diodes 181, 182 and 191, 192, which are coupled between nodes 166 and 167 and ground. The commonly connected cathode nodes 185 and 195 of the respective pairs of varactor diodes are coupled to receive a control voltage $V_\Phi$ applied to a control terminal 175. The control voltage $V_\Phi$ is coupled to control nodes 185 and 195 through respective coupling resistors 196 and 197.

In accordance with the operation of the varactor-based phase shifter of FIG. 9, as $V_\Phi$ is varied from +1V to +10V, the capacitance-to-ground admittance through the diode nodes 166 and 167 of the quadrature hybrid circuit 150 changes sufficiently to yield a change in phase (on the order of 120 degrees). The back-to-back diode configuration of FIG. 9 eliminates net capacitance changes introduced by RF drive, greatly reducing the level of odd order intermodulation products ($m_{f1}-n_{f2}$ where m $\leq$1, and m+n is odd). The result is a flat, phase linear, high intercept point phase shifter with low insertion loss and an extremely fast response.

Because both the variable attenuator 141 and phase shifter 143 have intercept points greater than +41 dBm with appropriately selected varactor diodes and MESFETS, the overall gain phase adjuster intercept point is over +38 dBm. Control bandwidth of both the variable attenuator 141 and phase shifter 143 is in excess of 20 MHz. Since amplitude and phase are virtually independent, the operation of gain/phase adjuster 111 is easy to control. The magnitude of the phase control range of phase shifter 143 can easily exceed the above range of 120°, making the device useful over more than one quadrant.

Figure 10:
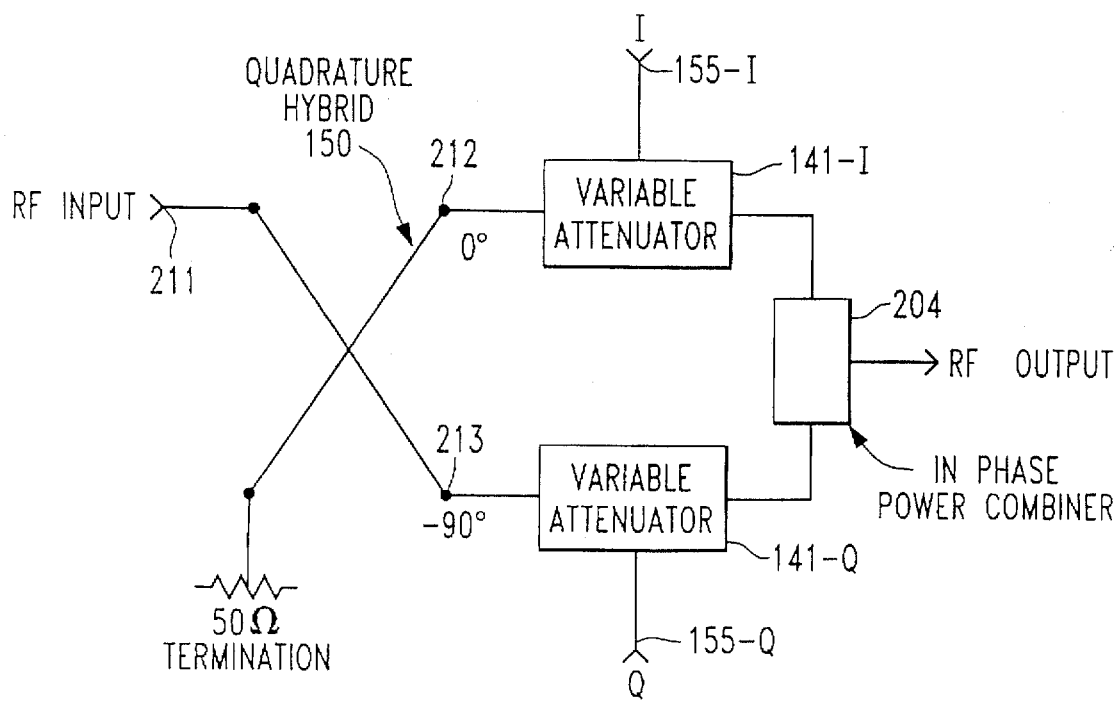
FIG. 10 diagrammatically illustrates the configuration of a vector modulator having a quadrature hybrid connected with two of the variable attenuators of FIG. 8.

As diagrammatically illustrated in FIG. 10, a vector modulator may be obtained by connecting a quadrature hybrid 201 with two of the variable attenuators of FIG. 8 shown at 141-I and 141-Q and an in-phase power combiner 204. In the operation of the vector modulator of FIG. 10, quadrature hybrid 201 splits an incoming signal at RF input terminal 211 into two equal amplitude signals, which are 90° out of phase (phase quadrature) at ports 212 and 213. Each quadrature signal is attenuated by a respective fast variable attenuator 141-I and 141-Q, in accordance with control inputs signal (I) and (Q) applied to control voltage inputs 155-I and 155-Q, respectively. The result is two phase quadrature vectors, each of which can have any desired amplitude from 0 to one-half that of the RF input power level.

Figure 11:
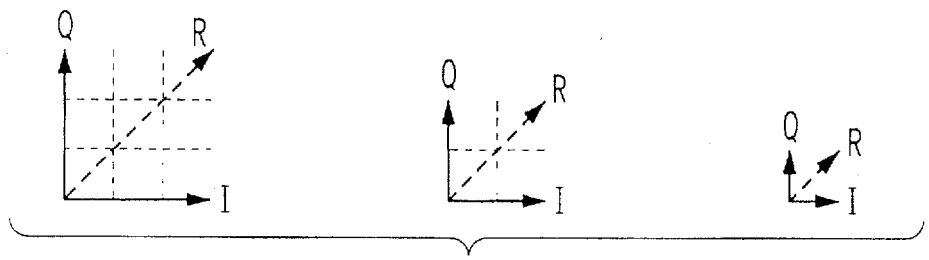
FIGS. 11 and 12 show the manner in which respective amplitude and phase are respectively controlled by simultaneously adjusting I and Q control voltages applied to control terminals of the respective variable attenuators of FIG. 10.
Figure 12:
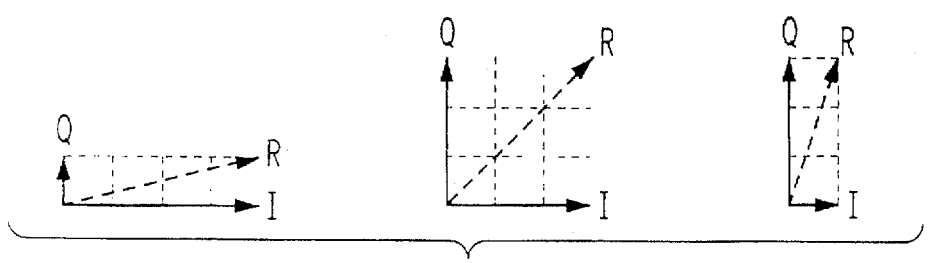
Figure 13:
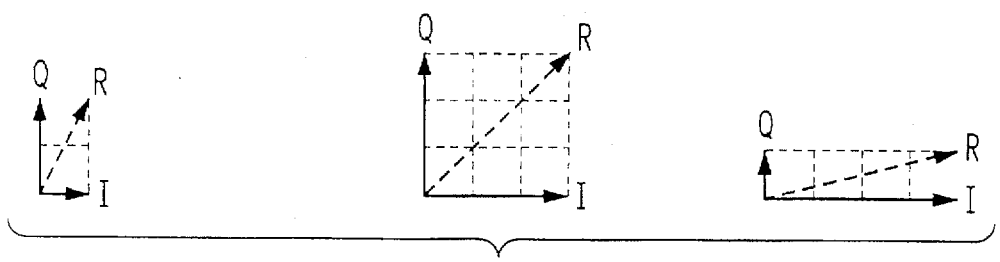
FIG. 13 shows the resultant vector change in both phase and amplitude obtained by adjusting the variable attenuators of FIG. 10.

When these signals are summed by the in-phase power combiner 204, what results is a vector modulator with a phase control range of nearly 90° and an amplitude control range of 15 dB. The intercept point of the vector modulator of FIG. 10 is 3 dB higher than that of the individual attenuators 141-I and 141-Q, due to the input power split taking place in the input quadrature hybrid 201. The overall insertion loss of the vector modulator is 6 dB over that of the insertion loss of the attenuators 141-I and 141-Q, making the minimum loss on the order of 8 dB. A +42 dBm intercept is readily achieved. The modulation bandwidth is that of the individual attenuators 141-I and 141-Q. As shown in FIGS. 11 and 12, amplitude and phase are respectively controlled by simultaneously adjusting the I and Q control voltages applied to control terminals 155-I and 155-Q, so as to result in a resultant vector having the desired amplitude and phase, as diagrammatically illustrated in FIG. 13.

Figure 14:
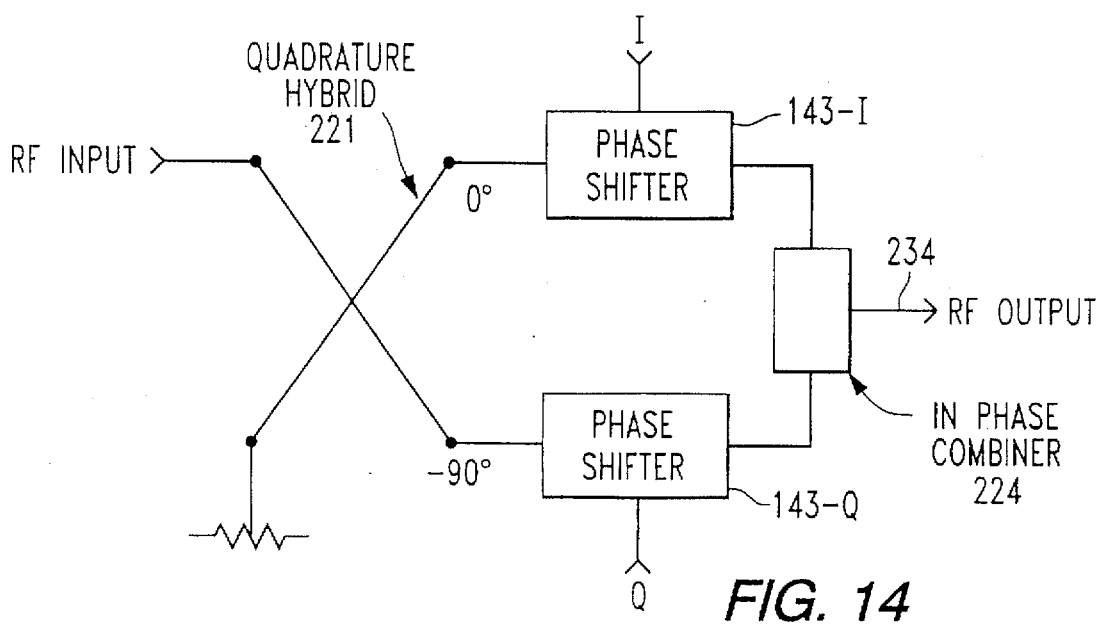
FIG. 14 diagrammatically illustrates replacement of the variable attenuators of the vector modulator of FIG. 10 by the phase shifter of FIG. 9.
Figure 15:
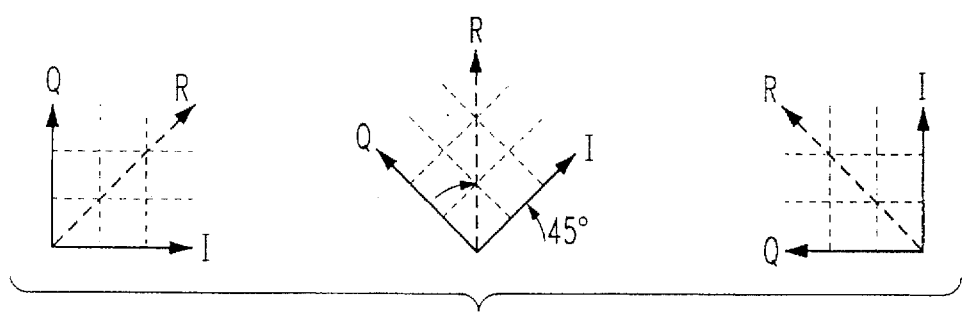
FIG. 15 shows the resultant vector R obtained by the simultaneously adjusting phase shifters 143-I and 143-Q of FIG. 14 so as to obtain the same phase change from both phase shifters.
Figure 16:
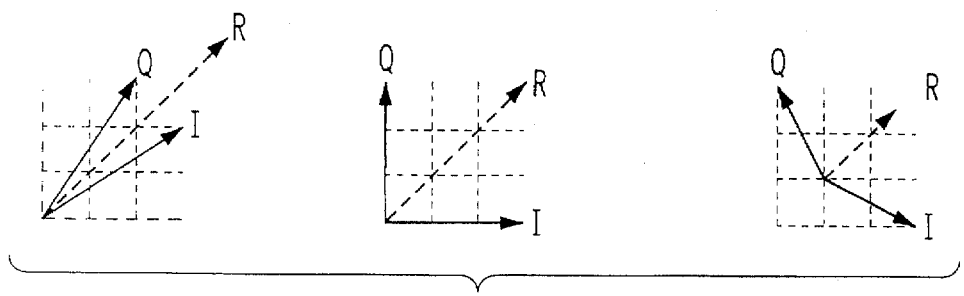
FIG. 16 shows the manner in which phase shifters of FIG. 14 are controlled to vary the phase angle between the I and Q vectors, to obtain a change in amplitude in the resultant signal vector R.

FIG. 14 diagrammatically illustrates replacement of the variable attenuators of the vector modulator of FIG. 10 by the phase shifter of FIG. 9, so as to provide an alternative embodiment of the vector modulator. In the vector modulator of FIG. 14, a quadrature hybrid 221 is coupled in circuit with two of the variable phase shifters of FIG. 9, shown at 143-I and 143-Q, and an in-phase power combiner 224. To operate the vector modulator of FIG. 14 as a phase shifter, the same control voltage step is applied to each of the phase shifter 143-I and 143-Q, so that both phase shifters produce identical phase shifts. As a result, each quadrature signal derived by quadrature hybrid 221, is subjected to the same amount of phase shift by phase shifters 143-I and 143-Q, as shown by the resultant vector R in FIG. 15. If a differential step is applied between the phase shifters, the amplitude of the resultant signal vector R derived at output port 234 may be controlled, as shown in FIG. 16. Thus, by simultaneously controlling the angle between the I and Q vectors to obtain the correct amplitude, and by rotating both vectors in unison to obtain the correct phase angle, a resultant signal vector R of any desired amplitude and any desired angle over more than a quadrant of phase shift range is obtained.

The vector modulator of FIG. 14 has excellent return loss, amplitude flatness and phase linearity. Its intercept point is also 3 dB higher than that of the individual phase shifters 143-I and 143-Q. The modulation bandwidth is the same as that of the individual phase shifters 143-I and 143-Q and can exceed 50 MHz. Thus, a very fast gain phase adjuster with greater than a +40 dBm third order intercept may be achieved.

As described briefly above, the function of the high speed PAC 125 of FIG. 4 is to generate an amplitude control signal $V_A$ that is proportional to the difference of the amplitude of the envelopes of the signals applied to the R and M ports 123 and 124, respectively, and to generate phase control signal $V_\Phi$ proportional to the phase difference between the envelopes of the signals.

Figure 17:
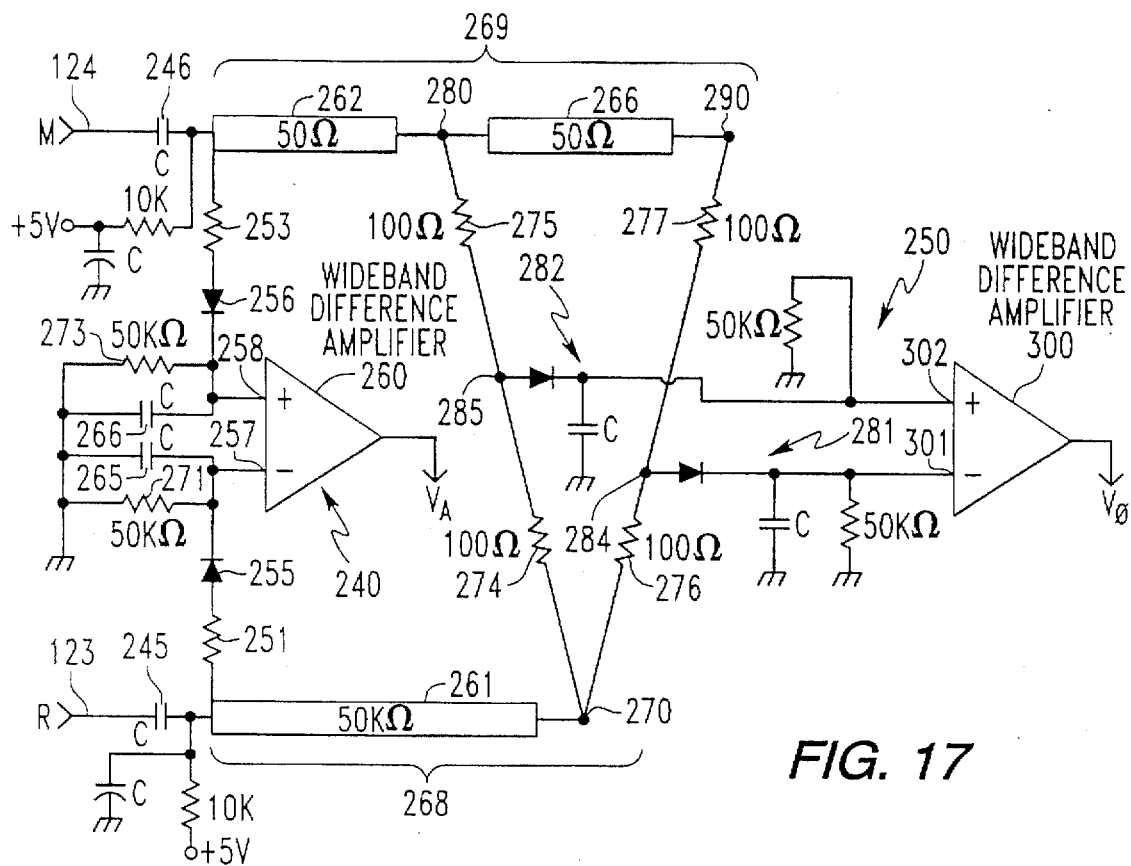
FIG. 17 schematically illustrates a first embodiment of a circuit implementation of the high speed phase/amplitude controller of FIG. 4, configured as a differential peak detector for envelope amplitude comparison and a phase bridge serving as a phase detector.

FIG. 17 schematically illustrates a first embodiment of a circuit implementation of the high speed phase/amplitude controller 125 of FIG. 4, configured as a differential peak detector 240 for envelope amplitude comparison and a phase bridge 250 serving as a phase detector. In the differential peak detector 240, input signals are coupled to respective R (reference) and M (measure) input ports 123 and 124 through respective dc blocking capacitors 245 and 246, resistors 251 and 253 and peak detector diodes 255 and 256 to (−) and (+) input ports 257 and 258 of differential amplifier 260. The (+) and (−) input ports 257 and 258 of differential amplifier 260 are further coupled through respective capacitors 265 and 266 and resistors 271 and 273 to ground. Isolation resistors 251 and 253, detector diodes 255 and 256, by-pass capacitors 265, 266 and video load resistors 271 and 273 comprise a pair of fast biased peak detectors which measure the amplitude of the envelopes of the signals delivered to the R and M ports of the PAC.

Differential amplifier 260 takes the difference between the voltages applied to its input nodes 257 and 258 in order to provide an output voltage that is proportional to the difference of the amplitude of the envelopes of the signals incident on the R and M ports 123 and 124. This difference voltage is the required amplitude control signal $V_A$. Detector time constants and differential amplifier bandwidth are selected so as not to be a dominant factor in setting the control loop's overall response, so as to ensure a stable loop with a single dominant pole.

The phase bridge detector 250 is realized with a simple phase bridge circuit. The bridge circuit is coupled to a fifty ohm section 261 of a transmission line 268, which is coupled to capacitor 245, and a fifty ohm resistor section 262 of a transmission line 269 coupled to capacitor 246. A resistor divider network, comprised of 100 ohm resistors 274 and 275, is coupled between nodes 270 and 280. A further fifty ohm transmission line section 266 of transmission line 269 is coupled between node 280 and node 290. A further resistor divider network comprised of 100 ohm resistors 276 and 277 is coupled between nodes 270 and 290. The parallel combination of resistors 275 and 277 terminate transmission line 269 and resistors 274 and 276 terminate transmission line 268 in a matched 50 ohm load due to the virtual ground existing at the center of each resistor divider.

Respective biased diode peak detectors 281 and 282, which connect the center nodes 284 and 285 of the resistive divider networks to the (−) and (+) inputs 301 and 302 of differential amplifier 300, sample the envelope of the signals derived from nodes 270, 280 and 290, along the matched, terminated transmission lines carrying the R and M signals. The difference between the outputs of peak detectors 281 and 282 is derived as output voltage $V_\Phi$ by differential amplifier.

The phase detector's differential amplifier output voltage $V_\Phi$ passes through zero, when the R and M input voltages applied to input terminals 123 and 124 are exactly 180° out of phase, which is precisely the response required for proper operation. The phase detector 250 has a practical range of ±60° about 180°. Range can be traded for sensitivity by altering the 15° spacing between the resistor divider nodes or tap points 280 and 290 along the M transmission line 269. The circuit shown in FIG. 17 is very cost effective when large amplitude signals are incident on the R and M input ports 123 and 124. It should be observed that care must be taken to achieve proper symmetry and to prevent reflections from upsetting the monotonic behavior of phase detector or moving the null off of the 180° point.

Figure 18:
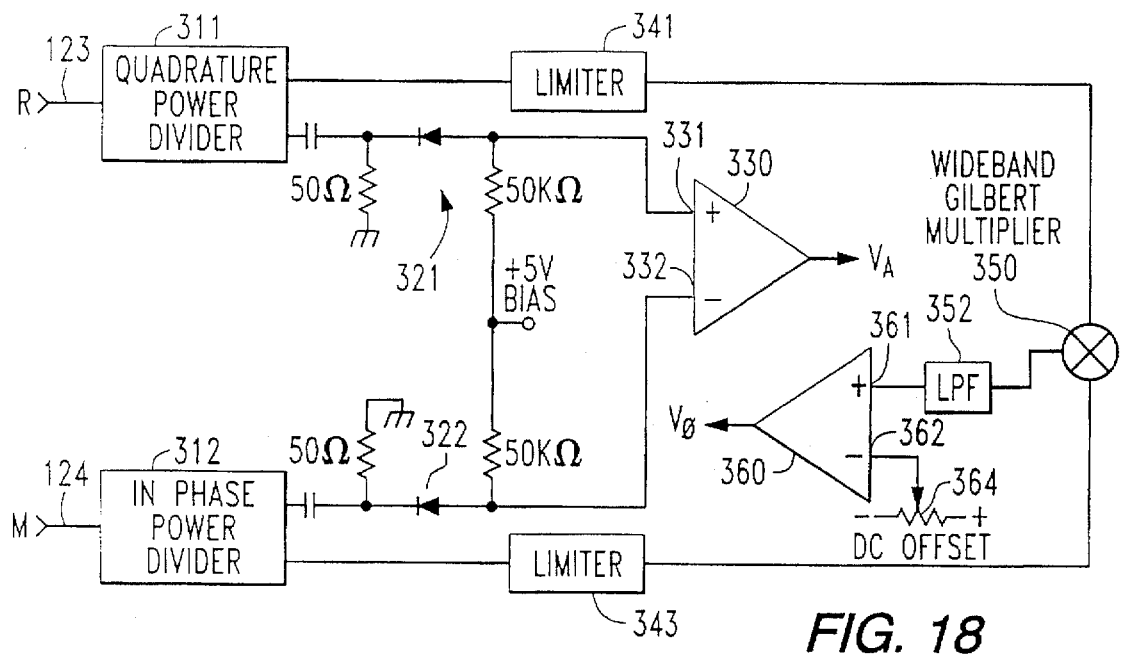
FIG. 18 schematically illustrates a second embodiment of a circuit implementation of the high speed phase/amplitude controller of FIG. 4, configured with peak detectors and a Gilbert multiplier.

FIG. 18 schematically illustrates a second embodiment of a circuit implementation of the high speed phase/amplitude controller 125 of FIG. 4, configured with peak detectors and a Gilbert multiplier. In the embodiment of FIG. 18, the R and M input terminals 123 and 124, respectively, are each split into two paths by quadrature power divider 311 and in phase power divider 312. The in phase R paths and one of the M paths are each peak detected by means of a pair of matched, biased diode detectors 321 and 322, respectively, and coupled to (+) and (−) inputs 331 and 332 of differential amplifier 330. The output of differential amplifier 330 is the control voltage $V_A$.

The control voltage $V_\Phi$ is obtained by multiplying the remaining quadrature R and in phase M signals limited by respective phase-matched limiters 341 and 343 in a wideband Gilbert cell multiplier 350 and low pass filtering the result by means of a low pass filter 352. The phase matched limiters 341 and 343 remove amplitude information and make the control voltage $V_\Phi$ nearly independent of amplitude. The output of the low pass filter 352 is coupled to the (+) input 361 of differential amplifier 360, while an adjustable DC offset voltage derived from variable resistor 364 is supplied to its (−) input 362.

The Gilbert cell multiplier 350 functions as a multiplier over at least 40 dB of dynamic range to either of its inputs as opposed to a diode mixer, which has less than 10 dB of dynamic range on its local oscillator port. The low pass filter 352 is operative to remove products at twice the RF frequency but does not impact loop bandwidth. The combination of the limiters 341 and 343, Gilbert cell multiplier 350, low pass filter 352, voltage offset 364 and differential amplifier 360 operate as a phase detector over nearly 180° of phase difference.

Figure 19:
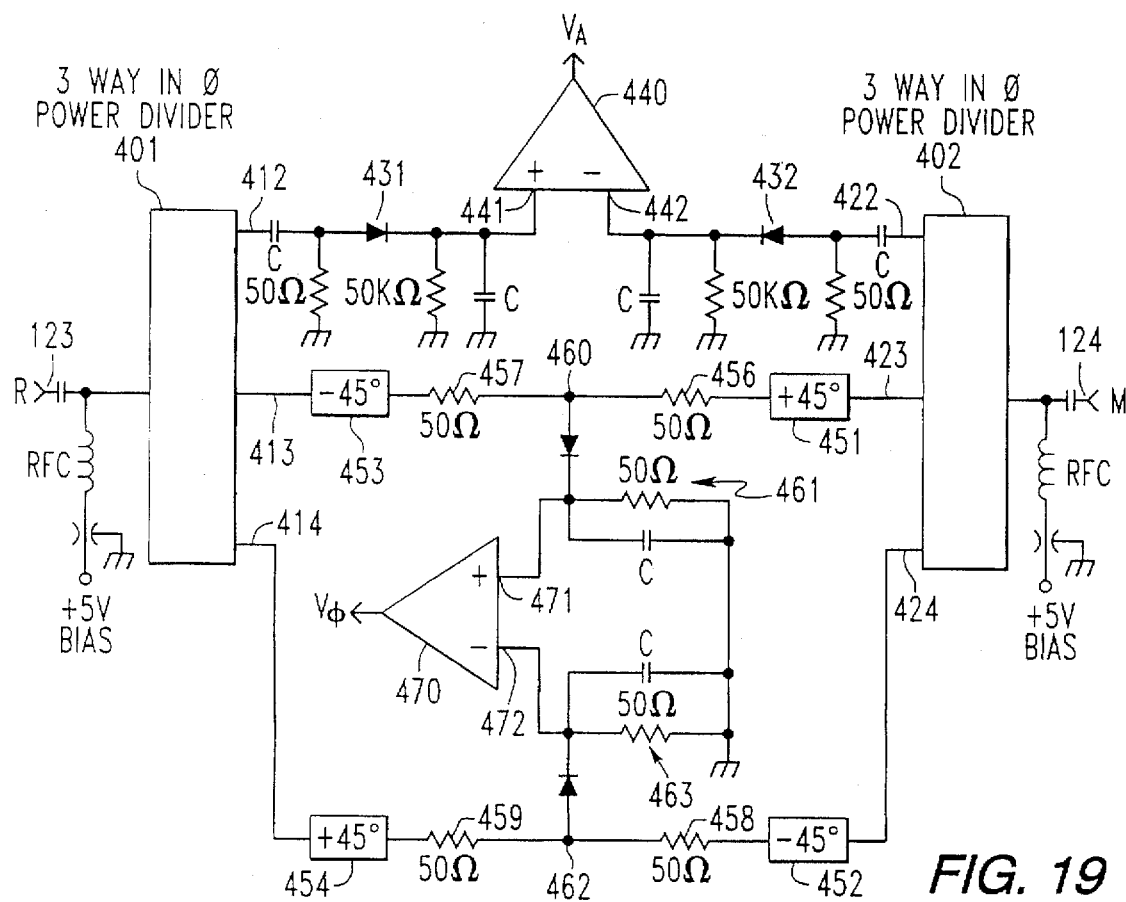
FIG. 19 schematically illustrates a further embodiment of the phase/amplitude controller of FIG. 4 employing passive ±45° phase shift networks.

FIG. 19 schematically illustrates a further embodiment of the phase/amplitude controller 125 of FIG. 4 by means of passive ±45° phase shift networks. As shown in FIG. 19, the respective signals incident at the R and M ports 123 and 124 of the phase/amplitude controller 125 are divided by a first in-phase, 3-way power divider 401 into three in-phase paths 412, 413 and 414, and a second in-phase, 3-way power divider 402 into three in-phase paths 422, 423 and 424.

The R signal path 412 and the M signal path 422 are coupled to respective peak detectors 431 and 432, which are applied to respective (+) and (−) inputs 441 and 442 of differential amplifier 440. The output of differential amplifier 440 provides amplitude control voltage $V_A$ as in the previous embodiments. The remaining M paths 423 and 424 are phase shifted by plus and minus 45° phase shifters 451 and 452, respectively, to yield a wideband +90° differential phase between the two M signals. Similarly, the R paths 413 and 414 are phase shifted by minus and plus 45° phase shifters 453 and 454, respectively, to yield a wideband −90° differential phase between the two R signals.

The +45° shifted M signal at the output of +45° phase shifter 451 is coupled through fifty ohm resistor 456 and summed at node 460 with the −45° shifted R signal at the output of phase shifter 453, which is coupled to node 460 through fifty ohm resistor 457. The resulting sum is peak detected by peak detector circuit 461, and applied to a first (+) input 471 of a high speed differential amplifier 470. Similarly, the −45° shifted M signal at the output of −45° phase shifter 452 is coupled through fifty ohm resistor 458 and summed at node 462 with the +45° shifted R signal at the output of +45° phase shifter 454, which is coupled to node 462 through fifty ohm resistor 459. Because of the virtual RF ground existing at nodes 460 and 462, each of the phase shifters is terminated in a matched 50 ohm load. The resulting sum is peak detected by peak detector circuit 463 and applied to the second (−) input 472 of differential amplifier 470. Differential amplifier 470 derives an output voltage $V_\Phi$ as the difference between the outputs of the two peak detectors 461 and 463, thereby providing a high speed phase detector with a ±90° range.

Figure 20:
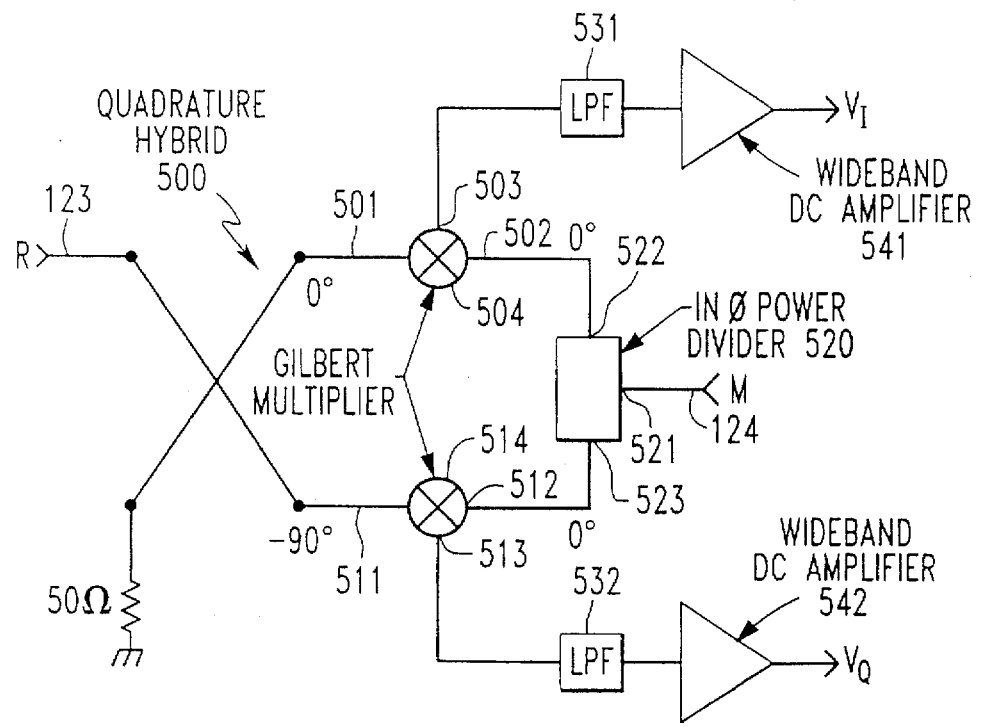
FIG. 20 shows a further embodiment of the PAC of FIG. 4, configured as an I,Q demodulator, using Gilbert multipliers in place of conventional diode based mixers.

FIG. 20 shows a further embodiment of the PAC 125 of FIG. 4, configured as an I,Q demodulator, using Gilbert multipliers in place of conventional diode based mixers. In the embodiment of FIG. 20, the R input 123 is divided by a quadrature hybrid 500 into quadrature signals that are coupled to first inputs 501 and 511 of respective Gilbert multipliers 504 and 514. Second, in-phase inputs 502 and 512 of Gilbert multipliers 504 and 514 are derived from the outputs 522 and 523 of an in-phase power divider 520 to an input 521 of which the M signal at input port 124 is applied. The outputs 503 and 513 of Gilbert multipliers 504 and 514 are coupled through respective low pass filters 531 and 532 to wideband amplifiers 541 and 542, from which the control voltages $V_I$ and $V_Q$, respectively, are derived.

With the exception of the embodiment of FIG. 20, each of the embodiments of the PAC 125 are polar output devices, producing output voltages that are proportional to the differences in amplitude and phase of the composite RF input (R and M) signals. Thus, the two RF input signals produce a pair of output control voltages in a polar format consisting of an amplitude control voltage and a phase control voltage.

The vector modulators shown in FIG. 10 are driven by rectangular formatted control signals designated I for the in-phase component and Q for the quadrature component. Thus, while a polar-based PAC will directly drive the simple gain/phase adjuster shown in FIG. 7, a network that approximates a polar to rectangular converter is required to drive the vector modulator based gain/phase adjusters illustrated in FIG. 10. The PAC shown in FIG. 20 will directly drive a vector modulator such as the one shown in FIG. 10. The vector modulator shown in FIG. 14 requires some processing of the polar PAC output voltages for proper operation.

The stability of both the amplitude and phase feedback loops may be analyzed using any of the standard techniques conventionally employed in communications technology. A well designed loop is dominated by only a single pole. This pole is provided by the amplitude and phase loop filters of FIG. 4. The other control components in the loop (gain-phase adjuster and phase amplitude controller) are designed to have a much wider bandwidth than the loop filter and to exhibit linear phase over the full control bandwidth. The time delay t through the power amplifier's main signal path 105 is such that 1/t is much greater than the full control bandwidth. Thus, loop stability is largely determined by the phase and amplitude function of each of the loop filters. Both loops (i.e., the phase control loop and the amplitude control loop) are designed to have adequate gain and phase margin to assure stability and acceptable transient behavior over all environmental conditions. As the occupied bandwidth of the modulated signal incident on the amplifier increases, the bandwidth of the control loops that is required to reduce amplifier distortion also increases. Increasing the control loop bandwidth requires that both the operational amplifiers and amplitude and phase modulators slew at extremely fast rates. However, a portion of the error being corrected by the loop is caused by temperature, component aging and the like, and is therefore quiet slow.

Figure 21:
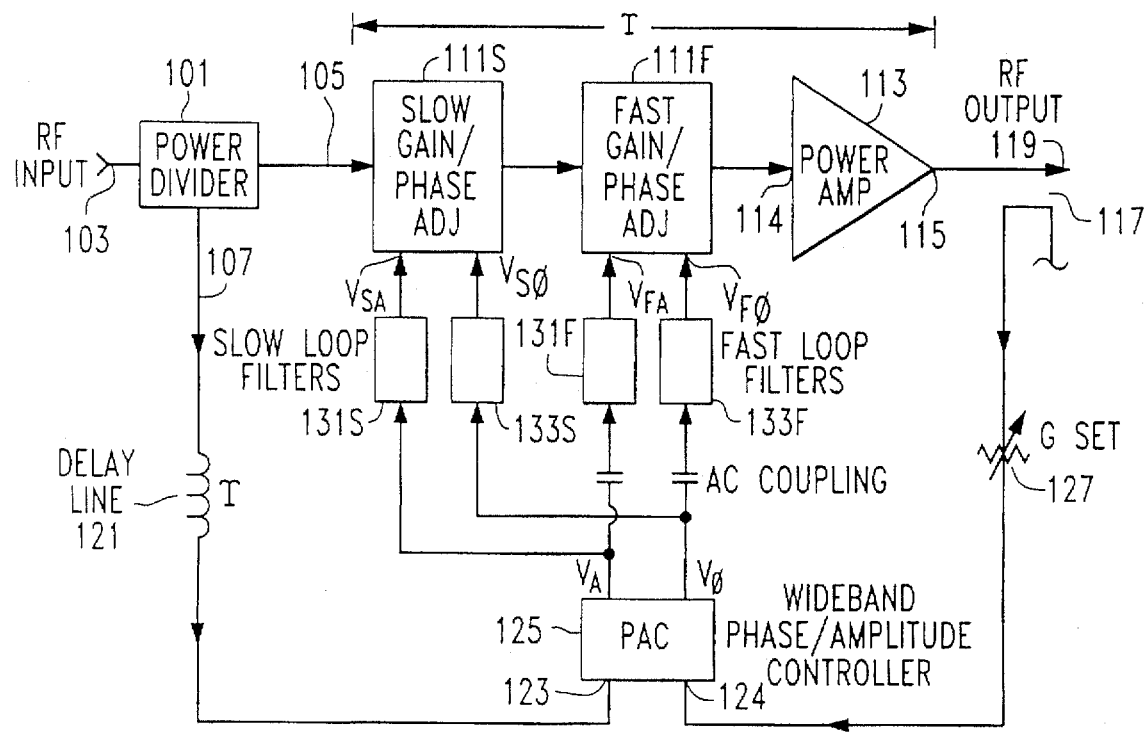
FIG. 21 diagrammatically illustrates a polar envelope correction mechanism of a second embodiment of the present invention, which breaks each control loop (amplitude and phase) into a fast loop and a slow loop.

As diagrammatically illustrated in FIG. 21, advantage can be taken of this fact by a polar envelope correction mechanism of a second embodiment of the present invention, which breaks each control loop (amplitude and phase) into a fast loop capable of correcting the amplifier's distortion in real time, at rates imposed by the modulation on the RF signal, and a slow loop that responds to slow changes in amplitude and phase induced by changes in the environment. The slow loop responds down to DC and the fast loop is AC coupled.

More particularly, in the embodiment of FIG. 21, the RF input signal is applied to input power divider 101, which splits or divides an input signal that is applied to an input terminal 103 into two signal paths 105 and 107. The main signal path 105 imparts a delay of t seconds and conveys the input signal to a slow gain/phase adjuster 111S, the output of which is cascaded with a fast gain/phase adjuster 111F. The output of fast gain/phase adjuster 111F is coupled to the input 114 of an RF power amplifier 113. The output 115 of RF power amplifier 113 is coupled through a directional coupler 117 to an RF output terminal 119.

The auxiliary input signal path 107 conveys the input signal through a delay line 121 to a first, R input 123 of phase-amplitude controller (PAC) 125. The second M input 124 of PAC 125 is coupled to receive the output signal extracted by the directional coupler 117 and fed back through gain set attenuator 127. Each of the control voltages $V_A$ and $V_\Phi$ generated by PAC 125 is coupled through a respective slow and fast pair of loop filters 131S, 131F and 133S, 133F, and used to control slow and fast gain/phase adjusters 111S and 111F in such a manner as to maintain constant gain and phase from the overall system's RF input to its output 119.

This type of loop not only reduces the slew rate requirements imposed on loop components but also reduces the amount of the range of the amplitude and phase adjuster that must be traversed at fast rates. Thus the fast loop can be centered in an optimal portion of the control component's (variable attenuator, phase shifter, vector modulator) operating curve. This greatly eases the task of obtaining stable, wide bandwidth control loops. It also makes it practical to use fast, high intercept control devices such as the vector modulator shown in FIGS. 10 and 14 and still maintain loop stability. Thus, breaking each loop into a respective fast loop that tracks the modulation envelope of the signal incident on the RF amplifier, and a slow loop that tracks only environmentally induced changes is an important tool, facilitating the design of stable wideband polar envelope correction loops.

A fundamental problem of all corrected amplifiers is determining if the correction circuitry is functioning properly. The present invention employs an alarm circuit, that is incorporated into the vector modulator based polar envelope correction system diagrammatically illustrated in FIG. 22, and that uniquely determines if the correction is valid. To appreciate how the alarm circuitry functions it is necessary to understand the basic operation of polar envelope correction.

Figure 22:
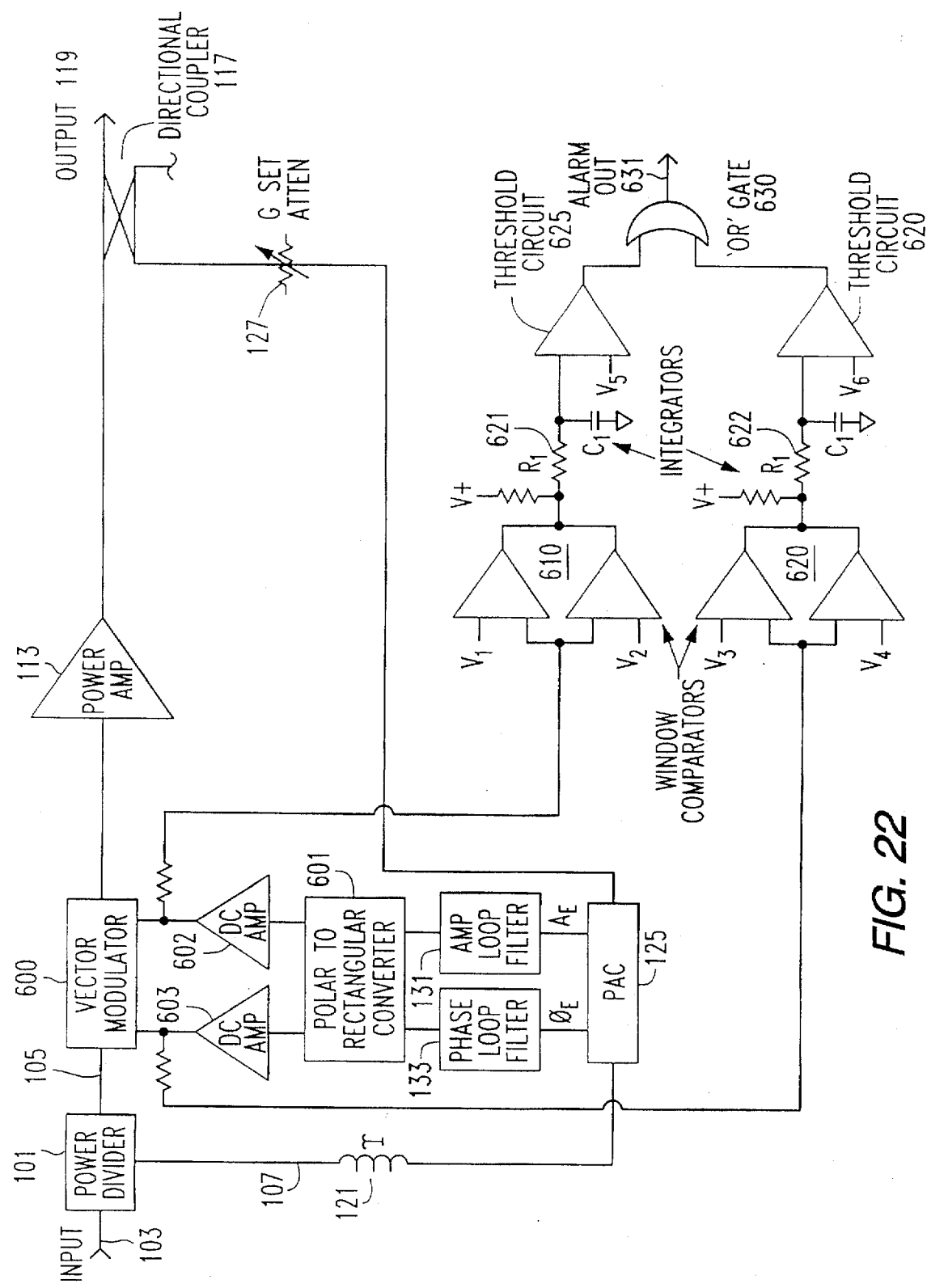
FIG. 22 shows the incorporation of an alarm circuit into a power amplifier circuit employing the vector modulator based polar envelope correction mechanism of the present invention.

In the block diagram illustration of FIG. 22, a sample of the undistorted input waveform applied to RF input terminal 103 and output over delay path 107 by power divider 101 is compared to the output (distorted) waveform derived from directional coupler 117 in PAC 125. In response to any difference between the RF input and output signals (i.e., distortion), PAC 125 generates amplitude and phase error signals, which are coupled through loop filters 131 and 133 to a polar-to-rectangular converter 601. Polar-to-rectangular converter 601 provides respective rectangular amplitude and phase signals which are amplified by amplifiers 602 and 603 and applied to vector modulator 600 which, subject to feedback loop stability limitations, instantaneously corrects phase and amplitude distortion of the signal transmitted through main path 105.

If the polar envelope correction mechanism is working properly, signals that drive the vector modulator 600 will fall within in a predetermined correction voltage window (e.g. 2–8 V). The voltage range for normal operation is determined by a combination of system parameters but is fixed for each design. Consequently, the vector modulator inputs signals are monitored by means of window comparator circuits 610 and 620, with any excursions beyond the normal voltage levels indicating a failure of the vector modulator to correct the error signals.

More particularly first and second respective threshold voltages $V_1$ and $V_2$ for amplitude and third and fourth respective threshold voltages $V_3$ and $V_4$ for phase define respective ranges between which correction is valid. Overall correction is determined by the average, not instantaneous, response of the vector modulator and consequently, it is necessary to integrate the output of the window comparators 610 and 620, by means of integrators 621 and 622. If the output of integrator 621 falls below $V_5$ for amplitude or if the output of integrator 622 falls below $V_6$ for phase, respective threshold detectors 625 and 626 provide alarm signals indicating that the correction is not valid. The outputs of threshold detectors 625 and 626 are coupled through an OR gate 630 to an alarm output terminal 631.

Failure of the correction circuitry of FIG. 22 is determined fundamentally when the output signal at output terminal 119 fails to track the input signal, whether it results from failure, environmental or input over drive conditions. This approach unambiguously determines failure and does not require monitoring all the various electronic circuits in a given system including power amplifier, RF gain stages, detection circuitry and any video circuits.

As will be appreciated from the foregoing description, by providing an amplitude and phase distortion correction strategy that is based upon signal envelope feedback, the present invention is able to take advantage of the relatively modest bandwidth of digital modulation formats, and provide a simple, yet efficient and effective scheme for extending the linearity of a non-linear microwave and RF power amplifier employed for digital modulation applications and having spectral components in the KHz to low MHz range. While complying with linearity and spectral regrowth requirements imposed by government regulatory agencies, the polar envelope correction mechanism of the invention does not require baseband information, as it operates directly on the RF signal passing through the power amplifier. The phase-amplitude controller responds to changes in main path gain and phase caused by changes in RF input power, DC power supply voltages, time, temperature and other variables. The feedback signal from the directional coupler controls the amplitude/gain and phase adjustment circuit, so that constant gain and transmission phase through the RF amplifier are maintained. The control system bandwidth is several times the highest frequency component contained in the envelope of the RF signal passing through the amplifier.

While we have shown and described several embodiments in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications as are obvious to one of ordinary skill in the art.

What is claimed:

1. A power amplifier circuit comprising:
    an input port to which an input signal to be amplified is applied;
    an output port from which an output signal is derived;
    a first signal path coupled to said input port;
    a power amplifier disposed in said first signal path and being operative to amplify said input signal applied to said input port and to provide an amplified output signal at said output port;
    a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port;

and wherein said gain and phase adjustment circuit comprises a variable attenuator coupled in cascade with a phase shifter, said phase shifter comprising a quadrature hybrid circuit terminated in a varactor diode circuit, said varactor diode circuit comprising a first pair of varactor diodes coupled between a first voltage reference node and a first port of said quadrature hybrid circuit, and a second pair of varactor diodes coupled between said first voltage reference node and a second port of said quadrature hybrid circuit, each of said first and second pairs of varactor diodes having first electrodes thereof connected in common and being coupled to receive a control voltage generated by said phase/amplitude controller.

2. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port;

and wherein said gain and phase adjustment circuit comprises a vector modulator containing a quadrature hybrid connected to first and second controlled phase shifters having vector outputs combined in an in-phase power combiner, to produce a resultant signal vector having a variable amplitude and phase in accordance with control signals generated by said phase/amplitude controller, and wherein each of said phase shifters comprises a quadrature hybrid circuit terminated in a varactor diode circuit, said varactor diode circuit comprising a first pair of varactor diodes coupled between a first voltage reference node and a first port of said quadrature hybrid circuit, and a second pair of varactor diodes coupled between said first voltage reference node and a second port of said quadrature hybrid circuit, each of said first and second pairs of varactor diodes having first electrodes thereof connected in common and being coupled to receive a respective control signal generated by said phase/amplitude controller.

3. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port; and wherein said phase/amplitude controller comprises a differential peak detector, which is operative to control gain adjustment imparted by said gain and phase adjustment circuit to said input signal to be amplified by said power amplifier, in accordance a relationship between amplitudes of the envelope of the delayed portion of said input signal conveyed over said second signal path and the envelope of said portion of said amplified output signal conveyed over said feedback signal path, so as to maintain constant gain through said power amplifier between said input port and said output port, and wherein said phase/amplitude controller further comprises a phase detector bridge circuit, which is operative to control phase adjustment of said input signal imparted by said gain and phase adjustment circuit, in accordance with a relationship between phases of the envelope of the delayed portion of said input signal conveyed over said second signal path and the envelope of said portion of said amplified output signal conveyed over said feedback signal path, so as to maintain constant phase through said amplifier between said input port and said output port, and wherein said phase detector bridge circuit is coupled through respective transmission line sections of a transmission line bridge to said first and second signal paths, and includes peak detectors which are operative to detect peaks of signals coupled through said respective transmission line sections, said peaks of signals being coupled to a differential amplifier, which provides, to said gain and phase adjustment circuit, a difference control signal $V_\Phi$ proportional to the difference of the phase of the envelopes of signals coupled through said respective transmission line sections.

4. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port; and wherein said phase/amplitude controller comprises a first power divider coupled to said feedback signal path and being operative to split said feedback signal path into third and fourth signal paths, and a second power divider coupled to said second signal path and being operative to split said second signal path into fifth and sixth signal paths, said third and fifth signal paths being coupled to peak detectors, which supply peaks of signals on said third and fifth signal paths to a first differential amplifier, the output of which is a control voltage $V_A$ for controlling the adjustment of gain of said input signal by said gain and phase adjustment circuit.

5. A power amplifier circuit according to claim 4, wherein said fourth and sixth signal paths are coupled through phase-matched limiters to a wideband Gilbert cell multiplier, an output of which is filtered by means of a low pass filter and applied to a first input of a second differential amplifier, said differential amplifier having a second input coupled to receive an adjustable DC offset voltage, said second differential amplifier having an output which generates a control voltage $V_\Phi$ for controlling the adjustment of phase of said input signal by said gain and phase adjustment circuit.

6. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port;

and wherein said phase/amplitude controller comprises a first in-phase, three-way power divider which divides said feedback signal path into third, fourth and fifth in-phase paths, and a second in-phase, three-way power divider which divides said second signal path into sixth, seventh and eighth in-phase paths, wherein said third and sixth paths are coupled to respective peak detectors, which are coupled to respective inputs of a first differential amplifier, said first differential amplifier providing an amplitude control voltage $V_A$ for controlling the adjustment of gain of said input signal by said gain and phase adjustment circuit.

7. A power amplifier circuit according to claim 6, wherein said fourth and fifth paths are phase shifted by plus and minus 45° phase shifters, to yield a +90° differential phase between said fourth and fifth paths, and where said seventh and eighth paths are phase shifted by minus and plus 45° phase shifters, to yield a −90° differential phase between said seventh and eighth paths, said phase shifted fourth and seventh paths being summed and coupled by way of a first peak detector to a first input of a second differential amplifier, and wherein said phase shifted fifth and eighth are summed and coupled by way of a second peak detector to a second input of a second differential amplifier, said second differential amplifier generating a control voltage $V_\Phi$ for controlling the adjustment of phase of said input signal by said gain and phase adjustment circuit.

8. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port;

and wherein said phase/amplitude controller comprises a quadrature hybrid, which is coupled to translate said second signal path into quadrature signals that are respectively coupled to first inputs of first and second Gilbert multipliers, second inputs of which are derived from first and second in-phase outputs of an in-phase power divider to which said feedback signal path is coupled, said first and second Gilbert multipliers being coupled through respective low pass filters to amplifiers, which generate control voltages $V_A$ and $V_\phi$ for controlling adjustment of gain and phase, respectively, of said input signal by said gain and phase adjustment circuit.

9. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port;

and wherein said gain and phase adjustment circuit comprises a slow gain/phase adjuster, connected in cascade with a fast gain/phase adjuster.

10. A power amplifier circuit according to claim 9, wherein said phase/amplitude controller is coupled through respective slow and fast loop filters to said slow gain/phase adjuster and said fast gain/phase adjuster, respectively.

11. A power amplifier circuit comprising:

an input port to which an input signal to be amplified is applied;

an output port from which an output signal is derived;

a first signal path coupled to said input port;

a power amplifier disposed in said first signal path and being operative to amplify said input signal applied to said input port and to provide an amplified output signal at said output port;

a gain and phase adjustment circuit installed in said first signal path and coupled in circuit with said power amplifier;

a second signal path coupled to said input port and being operative to delay a portion of said input signal conveyed thereover; and a phase/amplitude controller having a first input coupled via a feedback signal path to receive a portion of said amplified output signal and a second input port coupled to receive a delayed portion of said input signal conveyed over said second signal path, and controlling gain and phase adjustments imparted by said gain and phase adjustment circuit to said input signal to be amplified by said power amplifier, in accordance a relationship between the amplitudes and phases of the envelope of the delayed portion of said input signal conveyed over said second signal path and the envelope of said portion of said amplified output signal conveyed over said feedback signal path, so as to maintain constant gain and phase through said power amplifier between said input port and said output port; and further including an alarm circuit containing window comparator circuits that monitor control signals applied to said gain and phase adjustment circuit and are operative to generate an alarm signal in response to excursions beyond the normal control voltage levels indicating a failure of said gain and phase adjustment circuit to properly adjust the gain and phase of said input signal to be amplified by said power amplifier.

12. A power amplifier circuit according to claim 11, wherein outputs said window comparator circuit are integrated and coupled to respective threshold detectors that provide alarm signals indicating that adjustment of the gain and phase of said input signal to be amplified by said power amplifier is not valid, in response to a failure of an amplified signal at said output port to track the input signal applied to said input port.

* * * * *